Dec. 31, 1963

M. E. TALAAT 3,116,167

THERMOELECTRIC GENERATORS

Filed March 21, 1960

INVENTOR.

MOSTAFA E. TALAAT

BY Herman Seid

ATTORNEY.

3,116,167

THERMOELECTRIC GENERATORS

Mostafa E. Talaat, Towson, Md., assignor to Carrier Corporation, Syracuse, N.Y., a corporation of Delaware Filed Mar. 21, 1960, Ser. No. 16,266
4 Claims. (Cl. 136—4)

Figure 1:
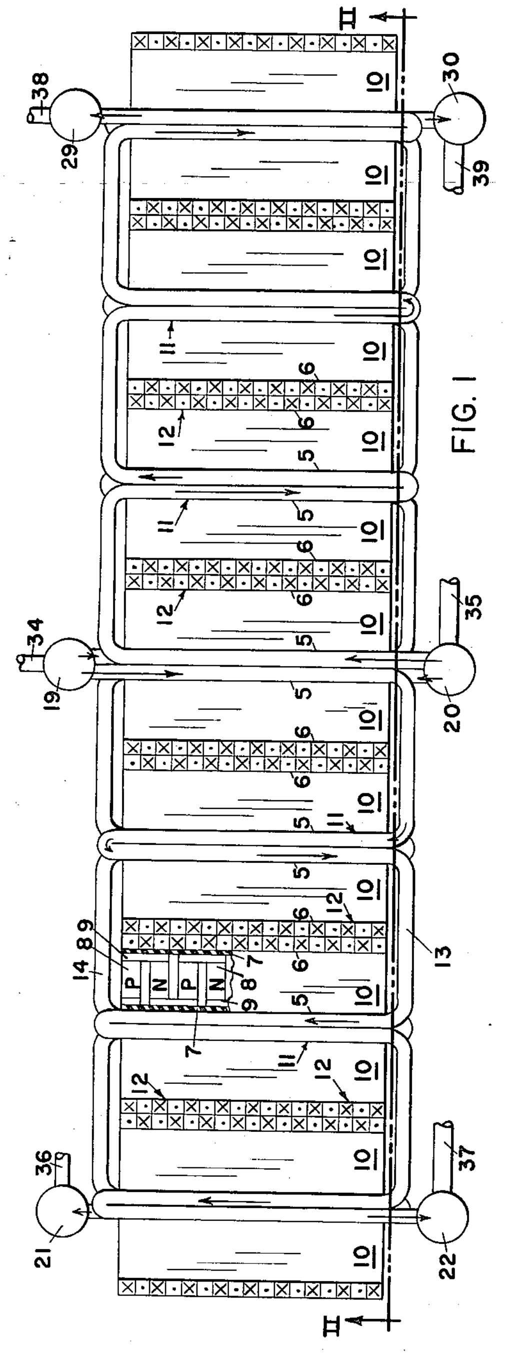

This invention relates to thermoelectric power generators and more particularly to an improved thermoelectric generator having a configuration of heat exchange conduits adapted to provide maximum operating efficiency and minimum generator size.

Thermoelectric generators are suitable for a number of applications where a sufficient source of heat is available to operate a generator. A desired source of heat, such as an atomic reactor, may be used primarily to operate a thermoelectric generator which ssrves to convert the energy released by the atomic reaction into the more useful form of electricity. In addition, heat is a wasted by-product of numerous machines such as internal combustion engines and steam or gas turbines. It is desirable to make the most efficient possible use of the waste heat from such machinery and an effective way of utilizing waste heat is through the addition of a thermoelectric generator to the system. The electrical power produced by the thermoelectric generator may then be utilized to operate the electrical circuitry which is often associated with such heat sources. For example, ignition and control circuitry of an internal combustion engine can be operated by electrical energy recovered from what would otherwise be waste heat. In the transportation field this feature is of particular importance because other sources of electrical power may not be readily available or may have too much weight or bulk to be desirable.

In many cases, however, a thermoelectric generator is not a practical means for utilizing heat available from a source because the size or weight of the generator makes such an installation impractical. Furthermore, for a thermoelectric generator to efficiently produce electricity, it is desirable to maintain the temperature across the face of the thermoelectric panels which comprise the generator substantially uniform in order to take advantage of the maximum figure of merit of the materials selected for the thermoelectric elements to secure maximum efficiency from the generator. It will be appreciated that it is desirable to maintain a uniform temperature particularly across the hot junctions of the thermoelectric elements which comprise a thermoelectric panel and to prevent hot and cold spots in the generator panel. If, for example, hot spots are allowed to exist in a thermoelectric panel, there is a risk of damage to the thermoelectric elements by diffusion of adjacent metals into the material of the thermoelectric element. Also, under certain circumstances circulating currents may be setup between the thermoelectric elements which will impair the overall efficiency of the panel. If the temperatures in a particular area are allowed to rise too high the metal of the thermoelectric element itself may melt. On the other hand, cold spots on the thermoelectric panel tend to cause loss of efficiency and may also result in circulating currents lowering the performance of the generator.

Accordingly, it is an object of this invention to provide an improved thermoelectric generator which provides a maximum electrical output for a minimum volume.

It is a further object of this invention to provide a thermoelectric generator having a configuration of heat exchange members associated therewith which provide a relatively uniform temperature across the thermoelectric elements in order to secure maximum efficiency from the generator.

It is a still further object of this invention to provide an improved thermoelectric generator which is capable of efficiently utilizing waste heat in an associated system to produce electric power.

These and other objects of my invention will become apparent by reference to the following specification and attached drawing. A thermoelectric generator made in accordance with this invention may comprise a plurality of thermoelectric panels. Each thermoelectric panel contains a plurality of thermoelectric elements electrically connected together to provide the electrical output of the generator. The thermoelectric panels are spaced from each other by heat exchange conduits which may be doubled back upon themselves in order to provide a counterflow relationship which tends to maintain the panels at a uniform temperature. In addition, the heat exchange conduits may comprise a plurality of heat exchange tubes which are disposed in generally parallel relation across the face of the thermoelectric panels. The heat exchange tubes are alternately brought out to separate headers so the fluid which it is desired to pass in heat exchange relation to the thermoelectric panels may divide into two streams which pass in counterflow relation to each other in order to provide an even more uniform temperature across the faces of the thermoelectric panels.

Figure 2:
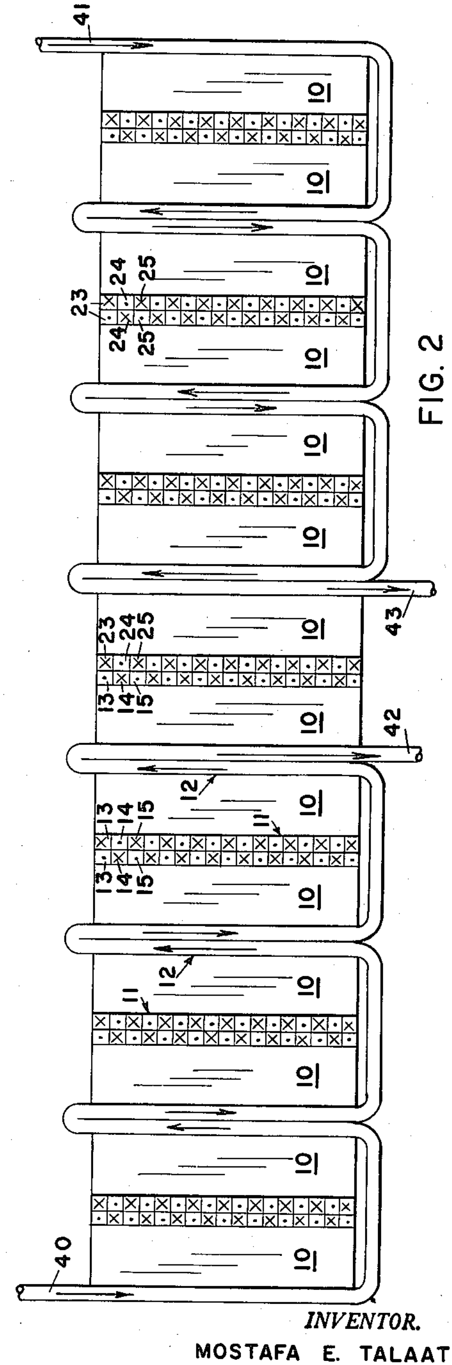

In the drawing,

FIGURE 1 shows a cross-sectional view through a thermoelectric generator made in accordance with the instant invention; and FIGURE 2 shows a cross-sectional view through the thermoelectric generator taken substantially on line II—II of FIGURE 1.

Referring particularly to FIGURE 1 a plurality of thermoelectric panels 10 are shown arranged substantially parallel to and spaced from one another. Each of the thermoelectric panels 10 comprise a plurality of thermoelectric elements 8 which are electrically connected to one another by jumpers 9. The thermoelectric elements are of alternately dissimilar thermoelectric material such as alternately connected P and N-type semi-conducting lead or bismuth telluride. The junctions formed by jumpers 9 are so arranged that junctions of one type e.g., the junctions to be heated having a P to N relation in a given direction lie adjacent one side 5 of thermoelectric panel 10 and junctions of the other type e.g., the junctions to be cooled having an N to P relation in a given direction lie on the other side 6 of thermoelectric panel 10. Jumpers 9 are insulated from the heat conducting metallic sides 5, 6 of the thermoelectric panels by a sheet of electrical insulation 7 of a suitable material such as mica or an epoxy resin. Appropriate electrical connections (not shown) are provided to carry the output of the generator to the desired apparatus to be operated by the generator. The thermoelectric panels can take any desired form, the one described having been shown merely for purposes of illustration.

Thermoelectric panels 10 are spaced from one another by first heat exchange conduit 11 and second heat exchange conduit 12. Thermoelectric panels 10 are disposed relative to one another so that sides 5 adjacent thermoelectric junctions of one type e.g., the type to be heated or hot junctions, are facing one another and sides 6 of thermoelectric panels 10 which are adjacent junctions of the other type e.g., the type to be cooled or cold junctions, are likewise facing each other. First heat exchange conduit 11 lies adjacent hot sides 5 of thermoelectric panels 10 and is adapted to pass a hot fluid in heat exchange relation with the thermoelectric junctions adjacent side 5 of panel 10. Second heat exchange conduit 12 lies adjacent cold sides 6 of thermoelectric panels 10 and is adapted to pass a cooling fluid in heat exchange relation with the thermoelectric junctions adjacent sides 6.

In the illustrated embodiment, first heat exchange conduit 11 is divided into right and left sections and the latter section comprises a plurality of heat exchange tubes, three of which have been designated 13, 14 and 15 in FIGURE 2. Each of the heat exchange tubes are disposed adjacent one another and are substantially parallel to one another across face 5 of thermoelectric panels 10. In addition, each of the heat exchange tubes which comprise first heat exchange conduit 11 are doubled back on themselves as can best be seen in FIGURE 1 so that hot fluid flowing through the tubes passes in counterflow relation to itself in order to maintain a substantially uniform temperature along the length of the tube. The tubes which comprise first heat exchange conduit 11 are alternately connected to header 19 and header 20 respectively. For example, tubes 13 and 15 are connected to header 19 and the other tubes which comprise first heat exchange conduit 11, such as tube 14 are brought out to other header 20. Headers 19 and 20 are connected to a source of hot fluid through pipes 34 and 35. It will be understood that the source of hot fluid may be the coolant of an atomic reactor or the exhaust of an internal combustion engine, gas or steam turbine or other source of hot fluid from which it is desired to recover the energy of primary or waste heat.

Hot fluid from a source thereof is divided into two portions, the first portion flows through pipe 34 into header 19 and the second portion flows through pipe 35 into header 20. As can be seen best from FIGURE 1, hot fluid from header 19 flows through tube 13 (and each of the alternate tubes such as tube 15) in one direction. Similarly, hot fluid flows from header 20 through the other tubes comprising first heat exchange conduit 11 (such as tube 14) in a counterflow relation to the hot fluid from header 19.

FIGURE 2 schematically illustrates the flow of fluid through the heat exchange tubes which comprise first heat exchange conduit 11 using the conventional notation that a cross represents fluid flowing into the plane of the drawing and a dot represents fluid flowing out of the plane of the drawing. It can be seen that heat exchange will take place between the tubes which comprise first heat exchange conduit 11 as well as with the thermoelectric junctions adjacent the hot sides 5 of thermoelectric panels 10. By this means, a very uniform temperature may be maintained across the face of the thermoelectric panels 10 so that each thermoelectric junction operates at substantially the same temperature as the other thermoelectric junctions in its associated thermoelectric panel thereby avoiding hot and cold spots on the sides of the thermoelectric panels.

The heat exchange tubes such as tubes 13 and 15 which are connected to header 19 pass between facing sides 5 of one pair of thermoelectric panels 10 to facing sides 5 of the next pair of thermoelectric panels and so on, to one end of the thermoelectric generator as shown in FIGURE 1. Alternate heat exchange tubes such as tubes 13 and 15 terminate in header 22 where the fluid may be returned for reheating through pipe 37 and recirculated through the system. The other heat exchange tubes which comprise the left section of first heat exchange conduit 11 terminate in header 21 and the fluid flowing therethrough may be returned to pipe 36 for reheating.

Hot fluid from headers 19 and 20 which are located at the center of the thermoelectric generator, also flows to the other end of the generator toward the right section as seen in FIGURE 1, through a plurality of heat exchange tubes 23, 24, 25, which also comprise first heat exchange conduit 11 and are arranged in a similar manner to that previously described. Alternate tubes such as tubes 23 and 25, extend from header 20 and terminate in header 29 where the fluid flowing therethrough is returned through pipe 38 for reheating. The other heat exchange tubes which comprise the right hand section of first heat exchange conduit 11 terminate in header 30 from which the fluid is returned through pipe 39 for reheating. It can be seen that the hot fluid flowing through the thermoelectric generator divides into two portions flowing in counterflow relation to each other toward one end of the thermoelectric generator from the center thereof and also divides into two more portions flowing into counterflow relation toward the other end of the thermoelectric generator.

A cooling fluid flows through second heat exchange conduit 12 from the ends of the thermoelectric generator towards its center in the direction of the arrows shown in FIGURE 2. In addition, second heat exchange conduit 12 may comprise a pair of sections with a plurality of heat exchange tubes 16, 17 and 18 on the left hand section of the thermoelectric generator and a plurality of heat exchange tubes 31, 32 and 33 on the right hand section of the thermoelectric generator as shown in FIGURE 1. Each of the heat exchange tubes which comprise second heat exchange conduit 12 may desirably be bent back upon themselves in a manner similar to that designed in connection with first heat exchange conduit 11. The flow of cooling fluid through second heat exchange conduit 12 may be in a single direction through each heat exchange tube comprising the conduit or the cooling fluid may be divided into two streams flowing in counterflow relation to each other through each section of the generator similar to that described in connection with first heat exchange conduit 11. Pipes 40 and 42 serve as supply and discharge pipes respectively for the cooling fluid flowing through the left hand section of the thermoelectric generator. Pipes 41 and 43 serve as supply and discharge tubes for the right hand section of the thermoelectric generator.

As will be observed by comparison of FIGURES 1 and 2, first heat exchange conduit 11 lies in substantially the same plane as second heat exchange conduit 12 but the heat exchange tubes comprise the conduits which are oriented at substantially right angles to each other so that the portions of the tubes which run from one pair of thermoelectric panels 10 to the adjacent pair do not interfere with each other.

It will be seen that by the construction described a relatively uniform temperature may be maintained across the faces of the thermoelectric panel and the thermoelectric elements which comprise the thermoelectric generator, in addition to which a highly compact arrangement is provided for the generator which conserves both weight and space making practical the use of such a generator for the recovery of waste heat.

While I have described a preferred embodiment of the invention, it will be understood the invention is not limited thereto since it may be otherwise embodied within the scope of the following claims.

I claim:

1. A thermoelectric generator comprising a plurality of thermoelectric panels, each said thermoelectric panel having a pair of sides between which are disposed a plurality of thermoelectric elements having dissimilar thermoelectric properties, said thermoelectric elements being connected and disposed within said panel so that thermoelectric junctions of one type are formed adjacent one side of said panel and thermoelectric junctions of another type are formed adjacent the other side of said panel, said thermoelectric panels being spaced from each other and arranged so that at least one side of each of said thermoelectric panels faces a side of another thermoelectric panel and that facing sides of said thermoelectric panels are each adjacent thermoelectric junctions of the same type, a first heat exchange conduit disposed adjacent and extending between and in heat exchange relation with sides of said thermoelectric panels which are adjacent thermoelectric junctions of one of said types, a second heat exchange conduit disposed adjacent and in heat exchange relation with sides of said thermoelectric panels which are adjacent thermoelectric junctions of the other of said types, said heat exchange conduits being adapted to carry hot and cold fluids, respectively, and pass them in heat exchange relation with the respective types of thermoelectric junctions adjacent which said conduits are disposed, said first heat exchange conduit comprising a plurality of heat exchange tubes disposed in generally parallel relationship along their adjacent panel sides, said generator further including at least a pair of headers associated with said first heat exchange conduit, the tubes of said first conduit being alternately connected to one and the other of said pair of associated headers so that the fluid flowing through said first conduit divides into two portions which flow in counterflow relation to each other to maintain a relatively uniform temperature across the adjacent sides of said thermoelectric panel by heat exchange between said tubes and the adjacent sides of said thermoelectric panel.

2. A thermoelectric generator as defined in claim 1 wherein said heat exchange tubes are doubled back on themselves thereby achieving a counterflow heat exchange effect in each tube as well as between adjacent tubes.

3. A thermoelectric generator as defined in claim 1 wherein said first conduit and said second conduit both comprise a plurality of heat exchange tubes which are doubled back on themselves thereby achieving a counterflow heat exchange effect between said tubes and the sides of the thermoelectric panels adjacent to which they are disposed.

4. A thermoelectric generator as defined in claim 1 wherein said first conduit is divided into two sections and said second conduit is divided into two sections, said sections extending outwardly from the center of said generator toward the ends thereof whereby a heating fluid may flow through said first conduit outwardly from the center panels of said thermoelectric generator to the outer panels and a cooling fluid may flow inwardly toward the center of said thermoelectric generator from the outer panels.

References Cited in the file of this patent

UNITED STATES PATENTS

| | | |
|---|---|---|
| 928,089 | Vokel | July 13, 1909 |
| 1,120,781 | Altenkirch et al. | Dec. 15, 1914 |
| 1,848,655 | Petrik | Mar. 8, 1932 |
| 2,886,618 | Goldsmid | May 12, 1959 |
| 2,937,218 | Sampietro | May 17, 1960 |
| 2,938,357 | Sheckler | May 31, 1960 |

FOREIGN PATENTS

| | | |
|---|---|---|
| 8,985 | Great Britain | Aug. 3, 1901 |